United States Patent
Hata et al.

(10) Patent No.: US 6,232,242 B1
(45) Date of Patent: May 15, 2001

(54) METHOD OF FORMING A CRYSTALLINE INSULATION LAYER ON A SILICON SUBSTRATE

(75) Inventors: Tomonobu Hata; Kimihiro Sasaki, both of Kanazawa; Akira Kamisawa, Kyoto, all of (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/395,983

(22) Filed: Sep. 15, 1999

Related U.S. Application Data

(62) Division of application No. 09/047,344, filed on Mar. 25, 1998.

(30) Foreign Application Priority Data

Mar. 25, 1997 (JP) ........................................ 9-71464

(51) Int. Cl.$^7$ .................................................... H01L 21/31
(52) U.S. Cl. .................... 438/762; 427/126.1; 427/126.3
(58) Field of Search ..................... 428/688, 690, 428/689; 427/457, 458, 470, 96, 126.1, 126.2, 126.3, 126.4, 126.5, 126.6; 438/761, 762, 763, 778, 503

(56) References Cited

U.S. PATENT DOCUMENTS

| | | | |
|---|---|---|---|
| 4,661,176 | * | 4/1987 | Manasevit . |
| 5,248,564 | * | 9/1993 | Ramesh . |
| 5,270,298 | * | 12/1993 | Ramesh . |
| 5,801,105 | * | 9/1998 | Yano et al. . |
| 5,919,515 | * | 7/1999 | Yano et al. . |
| 6,045,626 | * | 4/2000 | Yano et al. . |

\* cited by examiner

Primary Examiner—Chandra Chaudhari
Assistant Examiner—Evan Pert
(74) Attorney, Agent, or Firm—Arent Fox Kintner Plotkin & Kahn, PLLC

(57) ABSTRACT

Metal which forms a crystalline insulation layer is sputtered at a target and deposited as a film on a silicon substrate, the metal is chemically combined with reactive gas around the silicon substrate to thereby grow a crystal layer of a crystalline insulation substance, and a voltage is applied to the substrate so that ions of the reactive gas around the substrate are attracted to a surface of the silicon substrate and chemically combined with silicon, whereby an insulation silicon compound layer is formed at the interface of the silicon substrate and the crystalline insulation layer. As a result, a structure is obtained in which a crystalline insulation layer is formed on a crystalline silicon layer with an intervening amorphous insulation film which is formed by a silicon compound which has an excellent insulation characteristic. Hence, it is possible to epitaxially grow an additional semiconductor layer or a crystalline ferroelectric layer on a surface of the crystalline insulation layer, which makes it possible to form a three dimensional semiconductor device, a composite semiconductor device, a high performance semiconductor memory device or the like. Thus, it is possible to obtain a semiconductor device which is new and highly integrated at an inexpensive cost.

8 Claims, 2 Drawing Sheets

METHOD OF FORMING A CRYSTALLINE INSULATION LAYER ON A SILICON SUBSTRATE

This application is a divisional application of prior application Ser. No. 09/047,344 filed Mar. 25, 1998.

BACKGROUND OF THE INVENTION

The present invention relates to a method of producing a substrate for a semiconductor device, such as an SOI substrate and a substrate for a FET which has an MFS structure (metallic film/ferroelectric film/semiconductor layer structure), which is suitable for crystal growth of a semiconductor layer or a ferroelectric layer on a silicon substrate wherein an intevening amorphous insulation layer is formed. More particularly, the present invention relates to a method of forming a substrate for a semiconductor device in which a crystalline insulation layer may be grown with an intervening insulation layer which has an excellent insulation characteristic on a silicon substrate for the purpose of growing a semiconducting crystal layer, a ferroelectric crystal layer, etc., and to a method of manufacturing such a substrate.

In relation to an SOI substrate for growing a semiconducting crystal layer on an insulation layer, for instance, among known methods are a method which requires bonding two silicon substrate seating oxide films with each other and polishing one of the two substrates to thereby leave a thin semiconductor layer. Another method requires injecting oxygen or the like at a surface of a silicon substrate to a constant depth and then annealing so that an insulation layer is buried in a semiconductor substrate.

Meanwhile, in a semiconductor memory device using a ferroelectric layer, the ferroelectric layer is formed on a semiconductor layer or on a surface of an electrode metal such as platinum with an intervening insulation film. In an MFS structure in which a ferroelectric layer is formed on a semiconductor layer, an oxide film is formed between the ferroelectric layer and the semiconductor layer, thereby degrading a crystal quality or morphology, or an interface state density between the ferroelectric layer and the semiconductor layer becomes large. Where the ferroelectric layer is formed on an insulation film, it is not possible to grow a ferroelectric layer which has an excellent crystal quality on the insulation film which is amorphous.

As described above, during fabrication of a semiconductor device, while it is necessary to epitaxially grow a semiconductor layer or a crystalline ferroelectric layer on a semiconductor substrate through an insulation layer in some cases, since the insulation layer is amorphous, it is not possible to grow a crystalline layer directly on a surface of the insulation layer.

Further, in the method which requires polishing one of the bonded silicon layers for thinning the one silicon layer, it is extremely difficult to polish the silicon layer into a uniformly thin layer. Furthermore, polishing is laborious. Therefore, a quality crystalline surface is difficult to obtain. In the method which requires injecting oxygen at a surface layer portion of a semiconductor substrate, ion bombardment greatly degrades a surface of a semiconductor layer. Therefore, in this method a high quality crystalline surface is also difficult to obtain. As a result, a crystal layer which is formed on such a deteriorated crystalline surface has a deteriorated crystal quality.

On the other hand, the inventors of the present invention invented a method of epitaxially growing an YSZ thin film on a silicon substrate and presented the method to Shingaku Gihou (ED96-42, CPM96-27, May 1996). This method makes it possible to obtain a crystalline insulation layer on a silicon substrate and epitaxially grow a semiconductor layer or a ferroelectric layer on a surface of the YSZ. However, since a YSZ thin film which is formed on a silicon substrate is a crystalline metallic oxide film and hence migrates ions, electric insulation of the YSZ thin film is inferior to that of a silicon oxide film or a silicon nitride films. Therefore, the YSZ thin film slightly degrades electric characteristics.

SUMMARY OF THE INVENTION

The present invention has been made to solve such problems. Accordingly, an object of the present invention is to provide a substrate for a semiconductor device which is suitable to grow a crystal layer, such as a semiconductor layer and a ferroelectric layer, on another semiconductor layer having an intervening insulation layer during fabrication of a semiconductor device and which sufficiently improves electric insulation against a silicon substrate which serves as a base.

Another object of the present invention is to provide a method of forming a crystalline insulation layer on a semiconductor layer having an intervening insulation silicon compound.

A substrate for a semiconductor device according to the present invention comprises a crytalline silicon substrate, an insulation silicon compound layer which is formed on the silicon substrate, and a crystalline insulation layer which is epitaxially grown on the insulation silicon compound layer.

As herein termed, a "substrate for a semiconductor device" refers to a base for growing crystalline semiconductor layers and ferroelectric layers one atop the other, but not a complete base for a semiconductor device. In this context, a "substrate for a semiconductor device" covers a structure that an insulation silicon compound layer or a ferroelectric layer is formed in a portion of a semiconductor device, or on a stacked semiconductor layer, etc.

Where the crystalline insulation layer is formed by at least one species which is selected from a group of YSZ (yttria stabilized zirconia), $Al_2O_3$ (sapphire), $CeO_2$ (ceria), MgO (magnesia) and $ZrO_2$ (zirconia) and the insulation silicon compound layer is formed by at least one of silicon oxide, silicon nitride and silicon nitride oxide, a substrate for a semiconductor device which is particularly excellent in insulation and crystalline characteristics is obtained.

A method of manufacturing a substrate for a semiconductor device according to the present invention comprises the steps of:

growing a crystalline insulation layer on a silicon substrate by sputtering a metal which forms said crystalline insulation layer from a target, and chemically combining with reactive gas around said silicon substrate; and forming an insulation silicon compound layer by applying a voltage to said silicon substrate so that ions of said reactive gas around said substrate are attracted to a surface of said silicon substrate and chemically combined with silicon.

More specifically, the silicon substrate and the target are disposed facing each other within a reactive sputtering apparatus, the reactive gas is supplied into the apparatus in such a manner that there is a larger amount of the reactive gas around the substrate than around the target, and inert gas which is supplied into the apparatus is discharged and the crystal layer of the crystalline insulation substance is grown, whereby the substrate for a semiconductor device is obtained. Even more specifically, the target may be a composite target or an alloy target of zirconium (Zr) and yttrium (Y), the reactive gas may be oxygen, the crystalline insulation layer may be YSZ, and the insulation silicon compound may be silicon oxide.

When Ce, Al, Mg or Zr is used as the target, it is possible to grow $CeO_2$, $Al_2O_3$, MgO or $ZrO_2$, respectively, as the crystalline insulation layer.

The reactive gas may be supplied into the sputtering apparatus with the target covered with a cover which has an opening at a portion of the target which faces the silicon substrate. This simple structure allows deposition of a metal layer on the substrate without chemically combining the target as well as epitaxial growth of a compound of the metal of the target and the reactive gas on the substrate to form a crystalline insulation layer.

DETAILED DESCRIPTION

Figure 1:
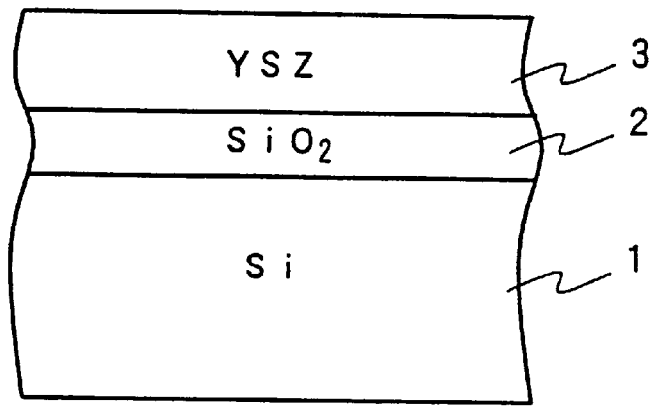
FIG. 1 is a cross sectional explanatory diagram showing a stacked structure of a substrate for a semiconductor device according to the present invention.

As shown in FIG. 1, in a substrate for a semiconductor device according to the present invention, an insulation silicon compound layer 2 which has an excellent electrically insulating characteristic, such as a silicon oxide film, is formed between a silicon substrate 1 and a crystalline insulation layer 3, such as YSZ, which is epitaxially grown on the silicon substrate 1.

The silicon substrate 1 is formed by a silicon monocrystalline layer. With respect to the conductivity of the silicon substrate 1, the silicon substrate 1 may be an n type layer, a p type layer, a semiconductor circuit in which an n type region, a p type region and the like are formed, or a silicon semiconductor layer formed entire or partially on other semiconductor layers or the like.

As the crystalline insulation layer (monocrystalline insulation layer) 3, a metallic compound, such as YSZ, $Al_2O_3$, $CeO_2$, MgO, $ZrO_2$ or any other metal oxide, which allows a crystalline structure to grow thereon is used. A crystalline structure of a metallic compound is obtained by growing metal on the silicon substrate 1 while oxidized, fluorinated, nitrided or otherwise chemically combined with metal on the substrate 1. The thickness of the crystalline insulation layer 3 is different depending on the application. If used as a base for growing another semiconductor layer or a crystalline ferroelectric layer, the crystalline insulation layer 3 is normally about 5 to 20 nm which is thick enough as such a base. Depending on the application, the crystalline insulation layer 3 may be formed into a thickness of approximately 0.5 to 1 $\mu$m.

As the insulation silicon compound layer 2, silicon oxide such as $SiO_2$, silicon nitride such as $Si_3N_4$, silicon nitride oxide such as SiON, or the like is used. As described later, such a compound is obtained by chemically combining of oxygen, nitrogen or the like which passes through the crystalline insulation layer 3 and reacts with silicon, during growth of the crystalline insulation layer 3, and therefore, is limited to a compound which is obtained by chemical combination with a substance which passes through the crystalline insulation layer 3. While determined in accordance with a breakdown voltage, etc., which is required in an expected application, the thickness of the insulation silicon compound layer 2 is normally about 10 to 60 nm.

In the substrate for a semiconductor device according to the present invention, the monocrystalline insulation layer is formed on the silicon substrate with an intervening amorphous insulation film. Hence, a surface of the semiconductor substrate has a crystalline structure, which allows for epitaxial growth of a further semiconductor layer or a crystalline ferroelectric layer on the surface of the semiconductor substrate. In addition, since the amorphous insulation film which is formed by a silicon compound is formed between the monocrystalline insulation layer and the crystalline silicon layer, the semiconductor substrate has an excellent insulation characteristic. This achieves very strong electric insulation between a layer which is formed at the surface of the crystalline insulation layer and the silicon substrate which is formed beneath. In short, while the monocrystalline insulation layer is a metallic compound, such as metal oxide, as described earlier, and therefore, has a slightly inferior insulation characteristic due to possible ion migration, silicon oxide, silicon nitride or the like realizes excellent electrical characteristics. This allows one to obtain an SOI substrate, to repeatedly form semiconductor layers through insulation layers on the crystalline silicon layer in which a semiconductor circuit is formed such that a three dimensional circuit is formed, or to form a crystalline ferroelectric layer of a ferroelectric material or the like into a quality crystalline structure to thereby obtain a semiconductor memory device which has excellent characteristics.

Figure 2:
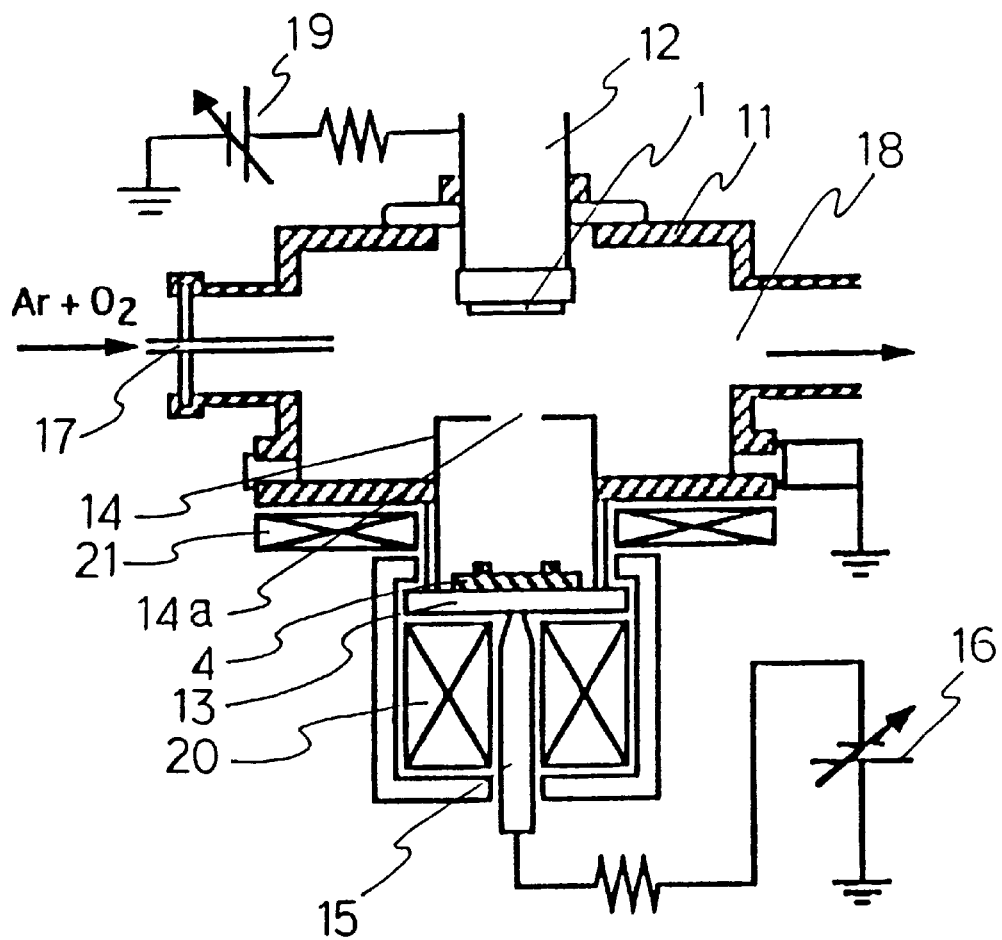
FIG. 2 is a schematic diagram showing an example of a sputtering apparatus for obtaining the stacked structure according to the present invention.

Now, a method of manufacturing the substrate for a semiconductor device according to the present invention will be described in relation to a specific example in which YSZ crystals are grown on a silicon substrate with an intervening silicon oxide film. FIG. 2 is a schematic diagram of a reactive sputtering apparatus for epitaxial growth, showing an example of an apparatus which is used in the manufacturing method.

Figure 3:
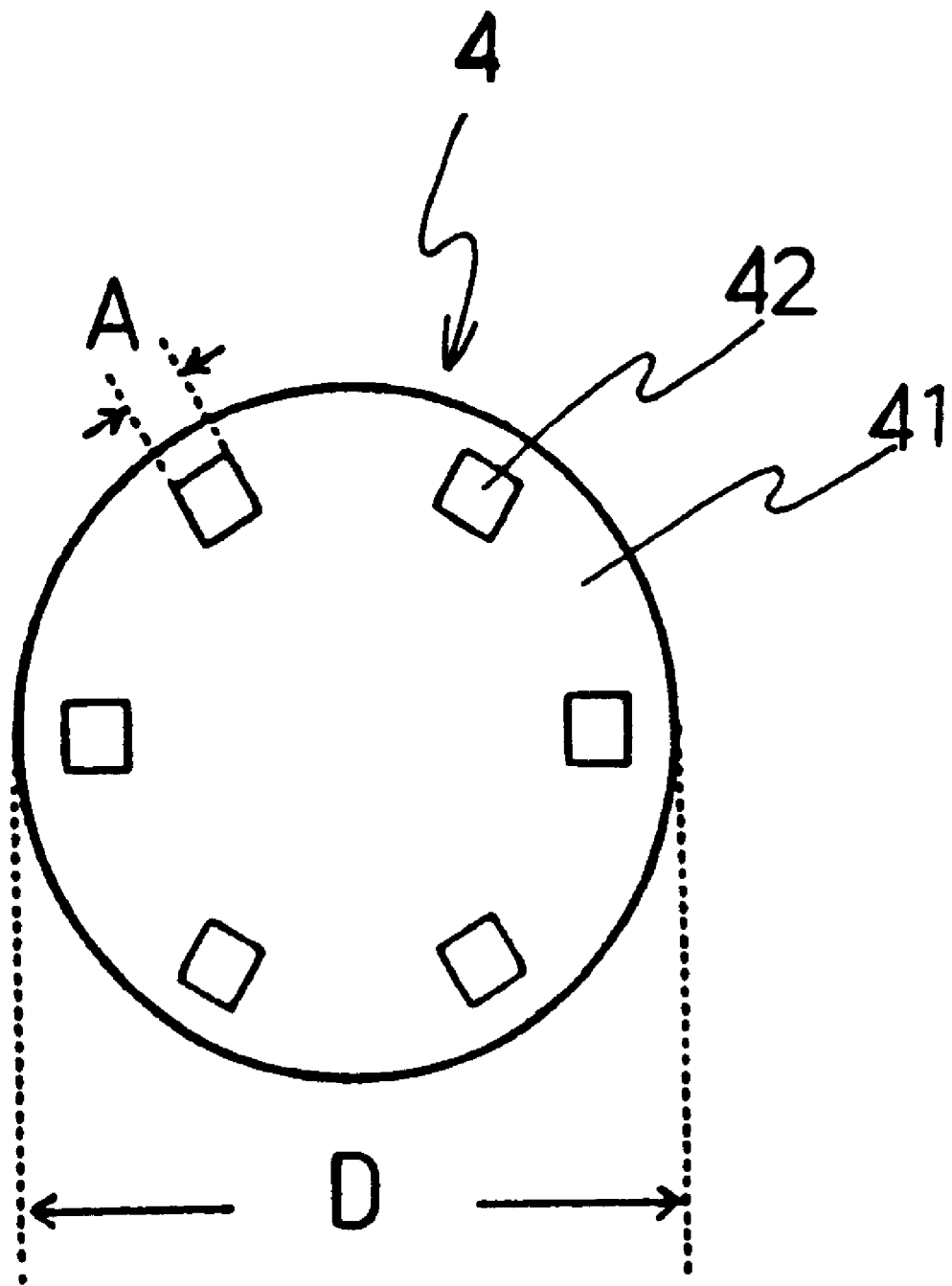
FIG. 3 is a view showing an example of a target which is used in the apparatus which is shown in FIG. 2.

First, a substrate 1 of a silicon semiconducting crystal layer which has a diameter of 1 inch is mounted to a substrate seater (mounting plate) 12 within a vacuum chamber 11 of the sputtering apparatus, and a target 4 is fixed to a target holder 13 which is disposed so as to face the substrate seater 12. The target 4 is a composite target which is obtained by attaching about six yttrium (Y) plates 42 whose each side A is about 10 mm and thickness is about 1 mm to a Zr plate 41 whose diameter D is about 100 mm and thickness is about 5 mm in a circumferential direction, for example as shown in FIG. 3, or an alloy target which is obtained by adding Y to Zr at 8 to 10%. Around the target 4, a cover 14 which has an opening 14a which has a diameter of about 20 mm or a collimator which has an equivalent effect is disposed in front of the target 4. Metal to be sputtered is passed through the opening 14a, while avoiding exposure of the target 4 to oxygen and resulting oxidation of the target 4. An electrode pole 15 is disposed in contact with the target holder 13, and a first power source 16 is connected between the electrode pole 15 and an earth with the electrode pole 15 serving as the negative pole so that a plasma discharge is created within the vacuum chamber 11. A gas introducing pipe 17 is disposed to one wall of the vacuum chamber 11 for supplying Ar and $O_2$ to the vacuum chamber 11, while a gas discharging exit 18 is formed in other wall of the vacuum chamber 11. Further, in this apparatus, a second power source 19 for attracting oxygen ions toward the substrate 1 and anodizing is provided between the substrate seater 12 and the earth with the substrate seater 12 serving as the positive pole. Denoted at 20 is a solenoid coil for developing a magnetic field at a surface of the target, and denoted at 21 is a solenoid coil for pressing the magnetic field against the surface of the target.

In such an apparatus, the silicon substrate 1 was mounted to the substrate seater 12 and in such a manner that a distance from the target 4 was 72 mm, for instance. As gas to introduce, Ar gas was supplied at a constant gas pressure of 10 mTorr, for example, and with a flow rate to oxygen of $O_2/(Ar+O_2)=5.8\%$, for instance. While epitaxially growing YSZ at a discharge power of 80 W and a substrate temperature of 600 to 800 °C., a positive voltage of approximately 50 V was applied from the second power source 19 to the substrate for anodization. As a result, an YSZ crystal layer was epitaxially grown at a rate of 40 nm/min and an $SiO_2$ layer was formed at a rate of about 1 nm/min between the substrate and the YSZ crystal layer. As to a relationship between the YSZ crystal layer and the $SiO_2$ layer in terms of thickness, the lower the applied voltage from the second power source 19 is, the thinner the $SiO_2$ layer is so that the proportion of the $SiO_2$ layer is small. Conversely, the higher the voltage from the second power source 19 is, the larger the proportion of the $SiO_2$ layer is. Further, the higher the discharge power (which is the voltage from the first power source 16) is, the thicker the YSZ crystal layer is and the larger the proportion of the YSZ crystal layer is. Conversely, the lower the discharge power is, the smaller the proportion of the YSZ crystal layer is. With respect to the discharge power, an applied voltage may be varied in the range of about 300 to 500 V. Meanwhile, the voltage for anodization (i.e., the voltage from the second power source 19) may be varied in the range of about 20 to 100 V. Hence, it is possible to grow each layer into a desired thickness.

As described above, the manufacturing method according to the present invention provides a method to sputter the metal which forms the crystalline insulation layer and grow the metallic compound on the substrate while reacting the metal with the reactive gas which is around the substrate and consequently forming the crystalline insulation layer of oxide or the like, and at the same time to create an insulation silicon compound on the surface of the substrate. That is, as described earlier, the inventors of the present invention disclosed, in Shingaku Gihou ED96-42, a method in which a layer is grown as it is in the metal mode without oxidizing the target and oxidized while grown, so that an YSZ thin film is epitaxially grown on a silicon substrate at a high deposition speed. Utilizing the nature of a crystalline insulation layer such as an YSZ thin film that the crystalline insulation layer transmits oxygen ions and the like, the present invention requires application of a voltage to a silicon substrate to thereby attract ions such as oxygen ions to the silicon substrate and chemically combine the ions with silicon while epitaxially growing a crystalline insulation layer such as an YSZ thin film, so that an insulation film (insulation silicon compound layer) which is formed by a silicon compound such as $SiO_2$ which has an excellent electric insulation characteristic is formed between the crystalline insulation layer such as YSZ and the crystalline silicon layer. In this case, the insulation film such as $SiO_2$ may be formed at a different time from growth of the crystalline insulation layer. So it produces a substrate for a semiconductor device which is formed by the crystalline silicon substrate, the insulation silicon compound layer which is formed on the silicon substrate, and the crystalline insulation layer which is formed on the insulation silicon compound layer.

In the manufacturing method according to the present invention, since the crystalline insulation layer is grown as it is in the metal mode which prohibits the target from chemically combining with the atmosphere, it is easy to epitaxially grow an insulation layer which has an excellent crystal structure. Further, to form the insulation film of a silicon compound on the silicon surface under the condition in which the crystalline insulation layer is provided on the silicon substrate, an amorphous insulation film may be formed at the interface between the crystalline insulation layer and the silicon substrate, without degrading the crystal quality of the crystalline insulation layer. In addition, as it is possible to form the crystalline insulation layer and the silicon compound approximately at the same time, it is possible to form the substrate for a semiconductor device in a short period of time.

While the target 4 is covered with the cover 14 which has the opening 14a in the sputtering apparatus described above, this is because if the target 4 is oxidized due to oxygen of the reactive gas, the oxide is sputtered and the sputtered oxide prevents to grow a film in the metal mode, and prohibited crystal growth eventually creates an amorphous film. Therefore, as far as oxidation of the target 4 is avoided, such a cover 14 is not necessary. In other words, in the example described above, the metal is sputtered and grown epitaxially to the surface of the substrate, and at the same time, utilizing activation of the metal, the metal is oxidized by oxygen of the atmosphere so that crystals of the metal oxide grows. Hence, the cover 14 may be omitted so that the partial pressure of the reactive gas, such as the partial pressure of oxygen, at the target 4 becomes very low, and the reactive gas such as oxygen may be blown toward the substrate 1 so that the partial pressure of the reactive gas becomes high only at the substrate 1.

Although the YSZ crystal layer is grown using Zr and Y as the target in the example described above, a film may be grown in the metal mode with a low partial pressure of oxygen in a similar manner using Ce as the target and oxidized at the surface of the substrate to thereby grow a crystal layer of $CeO_2$. Further, it is possible to grow a crystal layer of $Al_2O_3$ in a similar manner when Al is used as the target, and it is possible to grow a crystal layer of MgO or $ZrO_2$ when Mg or Zr is used as the target. In addition, instead of using oxygen as the atmosphere at the surface of the substrate, fluorine or nitrogen may be blown toward the substrate, so that a crystalline insulation layer which is formed by a compound of metal and fluorine or nitrogen is obtained.

Further, while the example described above requires that oxygen ions are attracted toward the silicon substrate, and silicon is oxidized so that silicon oxide is created between the crystalline insulation layer and the silicon substrate, nitrogen ions may be attracted and chemically combined to create silicon nitride. Alternatively, both oxygen ions and nitrogen ions may be attracted to create a silicon nitride oxide layer.

Further, although the crystalline insulation layer is grown by sputtering in the example described above, it is possible to manufacture in a similar manner in other method such as laser absorption, reactive evaporation, etc, if the chemical combination at the target is prohibited, and chemical combination may be caused during growth to the surface of the substrate.

According to the present invention, it is possible to obtain a structure in which a crystalline insulation layer is formed on a crystalline silicon layer with an intervening amorphous silicon-containing insulation film which has an excellent insulation characteristic. Hence, it is possible to epitaxially grow another semiconductor layer or a crystalline ferroelectric layer on a surface of the crystalline insulation layer, which makes it possible to form a three dimensional semiconductor device, a composite semiconductor device, a high performance semiconductor memory device or the like. Thus, it is possible to obtain a semiconductor device which is new and highly integrated at an inexpensive cost.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor substrate for a semiconductor device comprising the steps of:

growing a crystalline insulation layer on a silicon substrate by sputtering a metal which forms said crystalline insulation layer from a target, and chemically combining said metal with reactive gas around said silicon substrate; and forming an insulation silicon compound layer by applying a voltage to said silicon substrate so that ions of said reactive gas around said substrate are attracted to a surface of said silicon substrate and are chemically combined with silicon.

2. The method of claim 1, wherein said silicon substrate and said target are disposed facing each other within a reactive sputtering apparatus, said reactive gas is supplied into said apparatus in such a manner that there is a larger amount of said reactive gas around said substrate than around said target, and inert gas which is supplied into said apparatus is discharged, whereby said crystalline insulation layer is grown.

3. The method of claim 2, wherein said target is a composite target or an alloy target of zirconium and yttrium, said reactive gas is oxygen, said crystalline insulation layer is YSZ, and said insulation silicon compound layer is silicon oxide.

4. The method of claim 2, wherein Ce is used as said target, and a crystal layer of $CeO_2$ is grown as said crystalline insulation layer.

5. The method of claim 2, wherein Al is used as said target, and a crystal layer of $Al_2O_3$ is grown as said crystalline insulation layer.

6. The method of claim 2, wherein Mg is used as said target, and a crystal layer of MgO is grown as said crystalline insulation layer.

7. The method of claim 2, wherein Zr is used as said target, and a crystal layer of $ZrO_2$ is grown as said crystalline insulation layer.

8. The method of claim 1, wherein said reactive gas is supplied into said sputtering apparatus, with said target covered with a cover which has an opening at a portion of said target which faces silicon substrate.

* * * * *